(12) United States Patent
Han et al.

(10) Patent No.: US 11,436,143 B2
(45) Date of Patent: Sep. 6, 2022

(54) UNIFIED MEMORY ORGANIZATION FOR NEURAL NETWORK PROCESSORS

(71) Applicant: ALIBABA GROUP HOLDING LIMITED, Grand Cayman (KY)

(72) Inventors: Liang Han, San Mateo, CA (US);
Xiaowei Jiang, San Mateo, CA (US);
Jian Chen, San Mateo, CA (US)

(73) Assignee: Alibaba Group Holding Limited, Grand Cayman (KY)

( * ) Notice: Subject to any disclaimer, the term of this patent is extended or adjusted under 35 U.S.C. 154(b) by 69 days.

(21) Appl. No.: 15/984,255

(22) Filed: May 18, 2018

(65) Prior Publication Data

US 2019/0196970 A1    Jun. 27, 2019

Related U.S. Application Data (60) Provisional application No. 62/610,119, filed on Dec. 22, 2017.

(51) Int. Cl.
*G06F 12/0813* (2016.01)
*G06N 3/063* (2006.01)
(Continued)

(52) U.S. Cl.
CPC ........ *G06F 12/0813* (2013.01); *G06F 12/084* (2013.01); *G06F 12/0842* (2013.01); *G06N 3/063* (2013.01)

(58) Field of Classification Search
CPC ............... G06F 12/0813; G06F 12/084; G06F 12/0842; G06F 12/0284; G06F 12/0692;
(Continued)

(56) References Cited

U.S. PATENT DOCUMENTS 9,923,840 B2 *   3/2018   Cameron .............. G06F 9/5033
2003/0200378 A1  10/2003  Kirsch
(Continued)

FOREIGN PATENT DOCUMENTS

EP    3035204 A1    6/2016

OTHER PUBLICATIONS

PCT International Search Report and Written Opinion dated Apr. 15, 2019, issued in corresponding International Application No. PCT/US2018/67301 (15 pages).
(Continued)

*Primary Examiner* — Arpan P. Savla
*Assistant Examiner* — Edmund H Kwong
(74) *Attorney, Agent, or Firm* — Finnegan, Henderson, Farabow, Garrett & Dunner, LLP (57) ABSTRACT

The present disclosure relates to a unified memory apparatus having a unified storage medium and one or more processing units. The unified memory apparatus can include a first storage module having a first plurality of storage cells, and a second storage module having a second plurality of storage cells, each of the first and second plurality of storage cells configured to store data and to be identified by a unique cell identifier. The one or more processing units are in communication with the unified storage medium and the processing units are configured to receive a first input data from one of the first plurality of storage cells, receive a second input data from one of the second plurality of storage cells, and generate an output data based on the first and second input data.

28 Claims, 6 Drawing Sheets

(51) Int. Cl.
*G06F 12/0842* (2016.01)
*G06F 12/084* (2016.01)

(58) Field of Classification Search
CPC ......... G06F 12/0207; G06F 2212/1024; G06F 2212/1028; G06F 9/30043; G06N 3/063
See application file for complete search history.

(56) References Cited

U.S. PATENT DOCUMENTS

| | | |
|---|---|---|
| 2011/0078406 A1 | 3/2011 | Nickolls et al. |
| 2012/0075319 A1* | 3/2012 | Dally .................. G06F 12/0284 345/537 |
| 2014/0040565 A1* | 2/2014 | Asaro .................... G06F 12/06 711/147 |
| 2015/0248353 A1 | 9/2015 | McConnell |
| 2016/0179587 A1* | 6/2016 | Cole ....................... G06F 9/542 719/318 |
| 2016/0232107 A1* | 8/2016 | Ros .................... G06F 12/0897 |
| 2016/0283399 A1* | 9/2016 | Das Sharma ....... G06F 13/1663 |
| 2017/0060736 A1* | 3/2017 | Lin ....................... G06F 9/5016 |
| 2018/0307627 A1* | 10/2018 | Parker ................. G06F 12/1408 |

OTHER PUBLICATIONS

Extended European Search report dated Feb. 1, 2021, issued in corresponding European Application No. EP 18890583.0 (13 pages).

* cited by examiner

UNIFIED MEMORY ORGANIZATION FOR NEURAL NETWORK PROCESSORS

CROSS REFERENCE TO RELATED APPLICATION

The disclosure claims the benefits of priority to U.S. Provisional Application No. 62/610,119, filed Dec. 22, 2017, which is incorporated herein by reference in its entirety.

BACKGROUND

With the exponential growth of neural network based deep learning applications such as image recognition, speech/voice recognition, and machine translation, the commodity Central Processing Unit/Graphics Processing Unit (CPU/GPU) based platform is no longer a suitable computing substrate to support the ever growing computation demands in terms of performance, power efficiency and economic scalability. Developing neural network processors to accelerate neural-network-based deep-learning applications has gained significant traction across many business segments, including established chip makers, start-up companies as well as large Internet companies. Single Instruction Multiple Data (SIMD) architecture can be applied to chips to accelerate calculations for applications of deep learning.

In a computer with SIMD architecture, each of the parallel multiple processing units, Arithmetic Logic Units (ALUs) or small CPUs, compute simultaneously with their own data—generally 2 or 3 input operands and 1 output result. These data are stored in memory and are accessed independently in parallel. Thus, each processing unit can have a dedicated partition of memory and dedicated access ports to the partitions of memory. In practice, many algorithms have some shared data, which can be stored in some shared memory (to save storage cost) and be broadcasted to all processing units as one of the operands.

To enable parallel access in SIMD architecture, hardware generally introduces physically separated private memory modules and shared memory modules to hold corresponding type of data. However, such memory organization has two issues.

First, because the size of each hardware memory module is fixed while different software programs have different data sizes, these modules are inefficiently utilized, resulting in the waste of physical memory space. Second, dedicated memory copy operations have to be performed when previously considered "private" data becomes "shared" data in a later phase of the program. This causes extra power consumption and a drop in performance of the processing unit.

SUMMARY

Embodiments of this disclosure provide a unified memory apparatus. The unified memory apparatus can include a unified storage medium including a first storage module having a first plurality of storage cells configured to store data, the first plurality of storage cells identified by a unique cell identifier, and a second storage module having a second plurality of storage cells configured to store data, the second plurality of storage cells identified by a unique cell identifier. The unified memory architecture can also include a processing unit in communication with the unified storage medium. The processing unit can be configured to receive a first input data from one of the first plurality of storage cells, receive a second input data from one of the second plurality of storage cells, and generate an output data based on the first and second input data.

Some embodiments of this disclosure provide a unified storage medium. The unified storage medium can include a first storage module having a first plurality of storage cells configured to store data, the first plurality of storage cells identified by a unique cell identifier, and a second storage module having a second plurality of storage cells configured to store data, the second plurality of storage cells identified by a unique cell identifier.

Some embodiments of this disclosure provide a method for organizing data in a unified memory apparatus having a unified storage medium and one or more processing units. The method can include configuring a first storage module of the unified storage medium to communicate with the one or more processing units and to include a first plurality of storage cells that are configured to store data, the first plurality of storage cells identified by a unique cell identifier. The method can also include configuring a second storage module of the unified storage medium to communicate with the one or more processing units and to include a second plurality of storage cells that are configured to store data, the second plurality of storage cells identified by a unique cell identifier. The method further includes configuring a processing unit of the one or more processing units to receive a first input data from one of the first plurality of storage cells, receive a second input data from one of the second plurality of storage cells, and generate an output data based on the first and second input data.

Some embodiments of this disclosure provide a method for organizing data in a unified storage medium having a first storage module and a second storage module. The method can include configuring the first storage module of the unified storage medium to communicate with one or more processing units and to include a first plurality of storage cells that are configured to store data, the first plurality of storage cells identified by a unique cell identifier, and configuring the second storage module of the unified storage medium to communicate with one or more processing units and to include a second plurality of storage cells that are configured to store data, the second plurality of storage cells identified by a unique cell identifier.

The unique cell identifier of the first and second plurality of storage cells can comprise a bit address including a first plurality of bits and a second plurality of bits. The first plurality of bits can indicate a target storage module of the first and second storage modules, and the second plurality of bits can indicate a target storage cell of the first and second plurality of storage cells within the target storage module. The second plurality of bits can further indicate a characteristic associated with the target storage cell, the characteristic of the target storage cell being one of private or shared. In some embodiments, the first and second storage modules are configured to communicate with a corresponding processing unit. The processing unit is configured to receive the first input data from a private storage cell, and the second input data from a shared storage cell. The unified storage medium and the processing unit are configured to be uniformly addressed by a software code or a software program. The unified storage medium is further configured to receive instructions from a compiler, the instructions including a characteristic associated with the data, wherein the characteristic associated with the data is one of private or shared. The private storage cell is configured to store private data and the shared storage cell is configured to store shared data that can be shared across the multiple processing units.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The disclosed embodiments provide systems and methods for organizing data stored in a unified memory architecture and accessing the target data thereof. The disclosed embodiments can resolve the aforementioned issues of conventional SIMD architecture by organizing the physical private and shared memory in a unified way. The disclosed embodiments maintain a single module of physical memory for logical private and shared memory, and can switch the view of "private" or "shared" through the accessing instructions while keeping the data itself in its original location in the physical memory.

Figure 1:
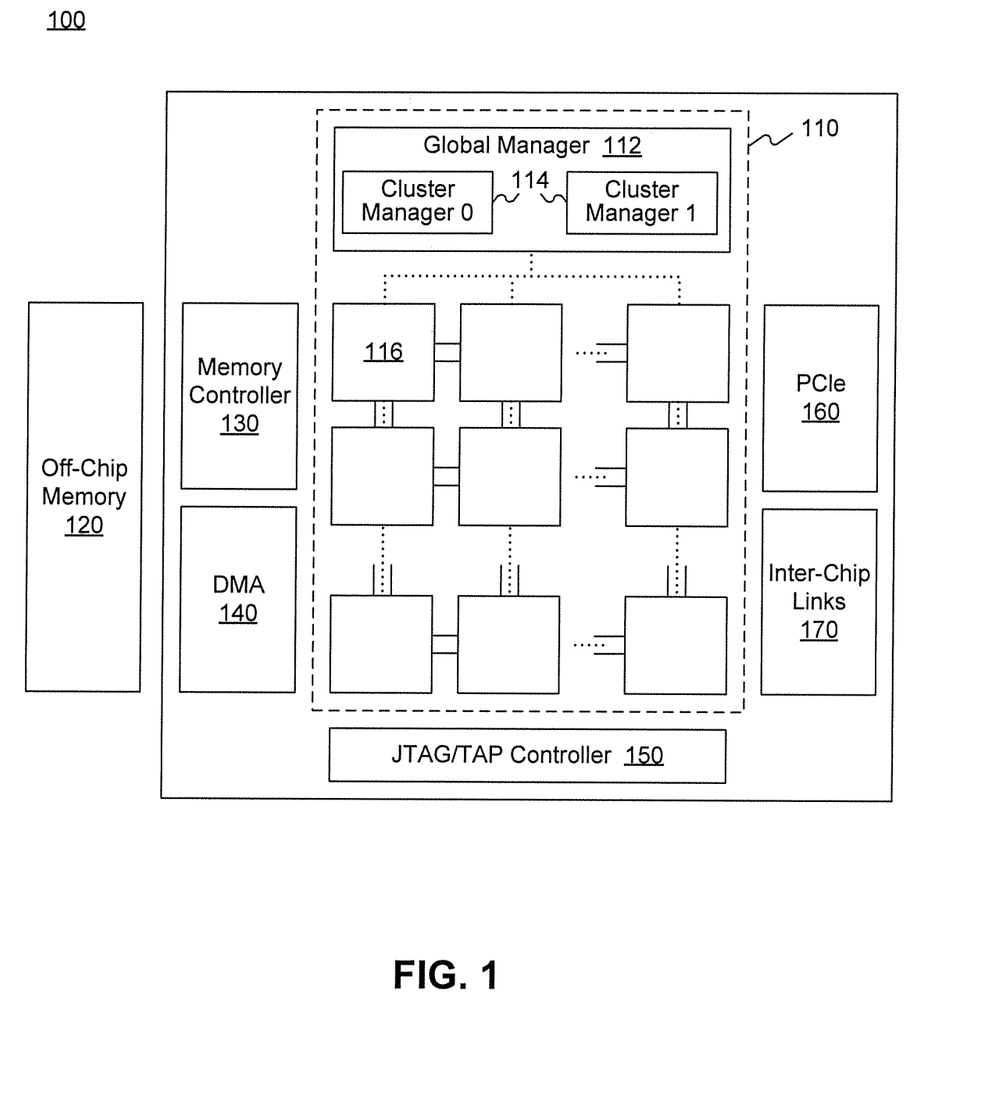
FIG. 1 illustrates an exemplary neural network processing unit (NPU) architecture, consistent with embodiments of the present disclosure.

FIG. 1 illustrates an exemplary neural network processing unit (NPU) architecture 100. NPU architecture 100 can include an on-chip communication system 110, an off-chip memory 120, a memory controller 130, a direct memory access (DMA) unit 140, a Joint Test Action Group (JTAG)/ Test Access End (TAP) controller 150, a peripheral component interconnect express (PCIe) interface 160, inter-chip links 170, and the like. It is appreciated that on-chip communication system 110 can perform algorithmic operations based on communicated data.

On-chip communication system 110 can include a global manager 112 and a plurality of tiles 116. Global manager 112 can include one or more cluster managers 114 configured to coordinate with one or more tiles 116. Each cluster manager 114 can be associated with an array of tiles 116 that provide synapse/neuron circuitry for the neural network. For example, the top layer of tiles of FIG. 1 may provide circuitry representing an input layer to neural network, while the second layer of tiles may provide circuitry representing a hidden layer of the neural network. As shown in FIG. 1, global manager 112 can include two cluster managers 114 configured to coordinate with two arrays of tiles 116. Tiles 116 can include one or more multipliers, adders, multiply-accumulators (e.g., a set of multiply-accumulators of a SIMD architecture) and corresponding memory and can be configured to perform an operation (e.g., one or more algorithmic calculations) on the communicated data under the control of global manager 112.

Off-chip memory 120 can include read-only memory (ROM), erasable programmable read-only memory (EPROM) or the like. Off-chip memory 120 can be configured to store a large amount of data with slower access speed, compared to the on-chip memory integrated within one or more processor.

Memory controller 130 can read, write, or refresh one or more memory devices. The memory devices can include on-chip memory and off-chip memory 120. For example, the memory device can be implemented as any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, or a magnetic or optical disk.

DMA unit 140 can generate memory addresses and initiate memory read or write cycles. DMA unit 140 can contain several hardware registers that can be written and read by the one or more processors. The registers can include a memory address register, a byte-count register, and one or more control registers. These registers can specify some combination of the source, the destination, the direction of the transfer (reading from the input/output (I/O) device or writing to the I/O device), the size of the transfer unit, and/or the number of bytes to transfer in one burst.

JTAG/TAP controller 150 can specify a dedicated debug port implementing a serial communications interface (e.g., a JTAG interface) for low-overhead access without requiring direct external access to the system address and data buses. The JTAG/TAP controller 150 can also specify an on-chip test access interface (e.g., a TAP interface) that implements a protocol to access a set of test registers that present chip logic levels and device capabilities of various parts.

Peripheral interface 160 can support full-duplex communication between any two endpoints, with no inherent limitation on concurrent access across multiple endpoints.

Inter-chip links 170 can connect all the internal components of NPU architecture 100, such as on-chip communication system 110, off-chip memory 120, memory controller 130, DMA unit 140, JTAG/TAP controller 150, and PCIe interface 160 to each other.

While NPU architecture 100 incorporates the embodiments of the present disclosure, it is appreciated that the disclosed embodiments can be applied to chips with SIMD architecture for accelerating some applications such as deep learning. Such chips can be, for example, GPU, CPU with vector processing ability, or neural network accelerators for deep learning. SIMD or vector architecture is commonly used to support computing devices with data parallelism, such as graphics processing and deep learning. The SIMD architecture can include multiple processing elements, wherein each of the processing elements can perform the same operation on multiple data points simultaneously.

For example, the private memory can be memory dedicated to serving data for each single processing element among multiple parallel processing elements, while shared memory can refer to memory dedicated to serving data for all parallel processing elements.

Figure 2A:
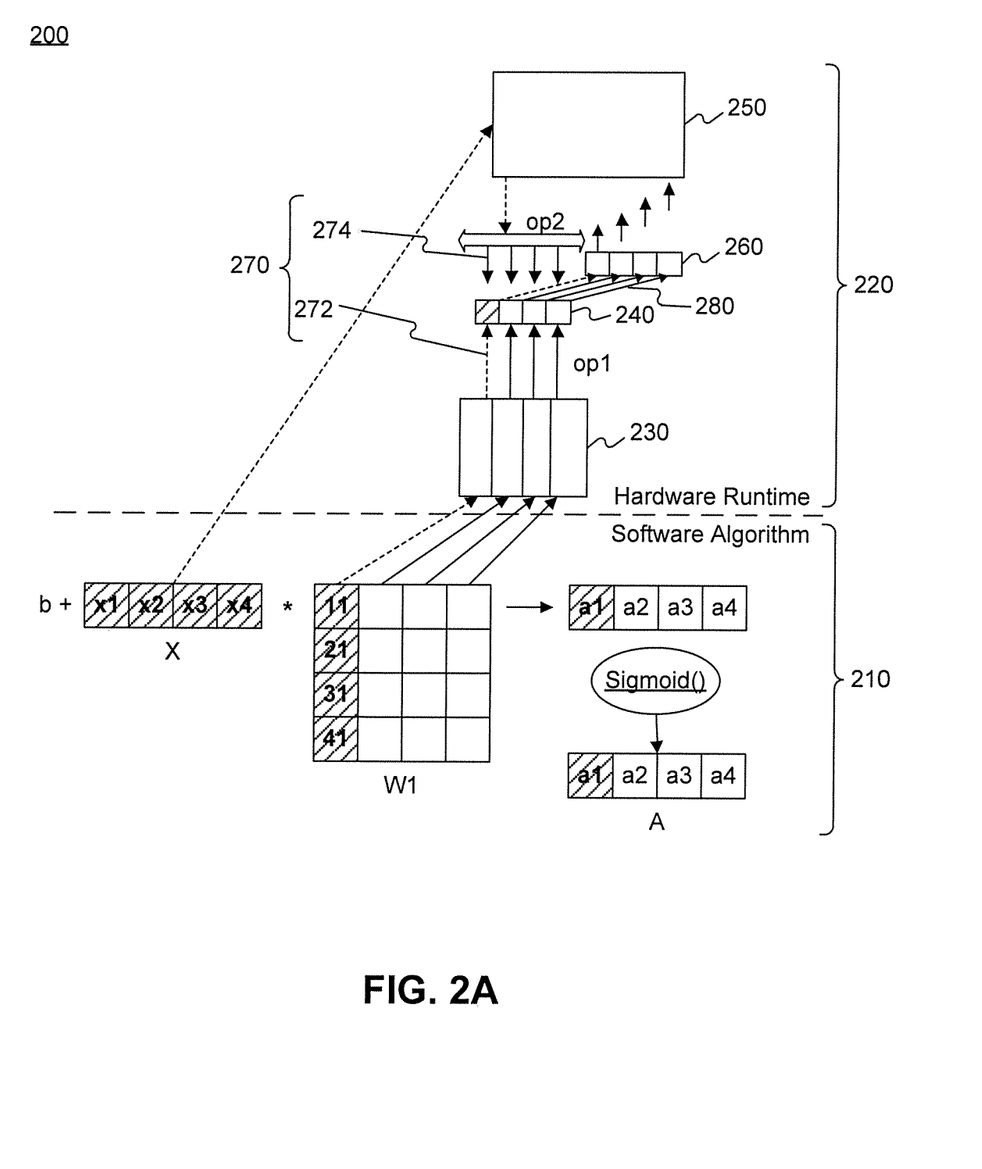
FIG. 2A illustrates an exemplary functionality of a layer of neural network processor, consistent with embodiments of the present disclosure.

FIG. 2A illustrates an exemplary functionality of a layer 200 of neural network, including a software algorithm 210 and hardware 220. Hardware 220 can include a private memory module 230, a processing unit array 240, a shared memory module 250, a write buffer 260, input operands 270, output operand 280, and the like. In some embodiments, hardware 220 can be located in a tile (e.g., tile 116 of FIG. 1).

In some embodiments, a processing unit of processing unit array 240 can be an Arithmetic Logic Unit (ALU), a Floating Point Unit (FPU), a CPU, a GPU, or the like. An ALU is a fundamental building block of a computing circuit, including the CPU of computers. A single CPU can contain one or more ALUs. Generally, an ALU is a combinational digital electronic circuit that performs arithmetic and bitwise operations on integer binary numbers. Processing unit array 240 can include multiple processing units 242, 244, 246, and 248, for example, an array of processing units, as illustrated in FIG. 2B.

Figure 2B:
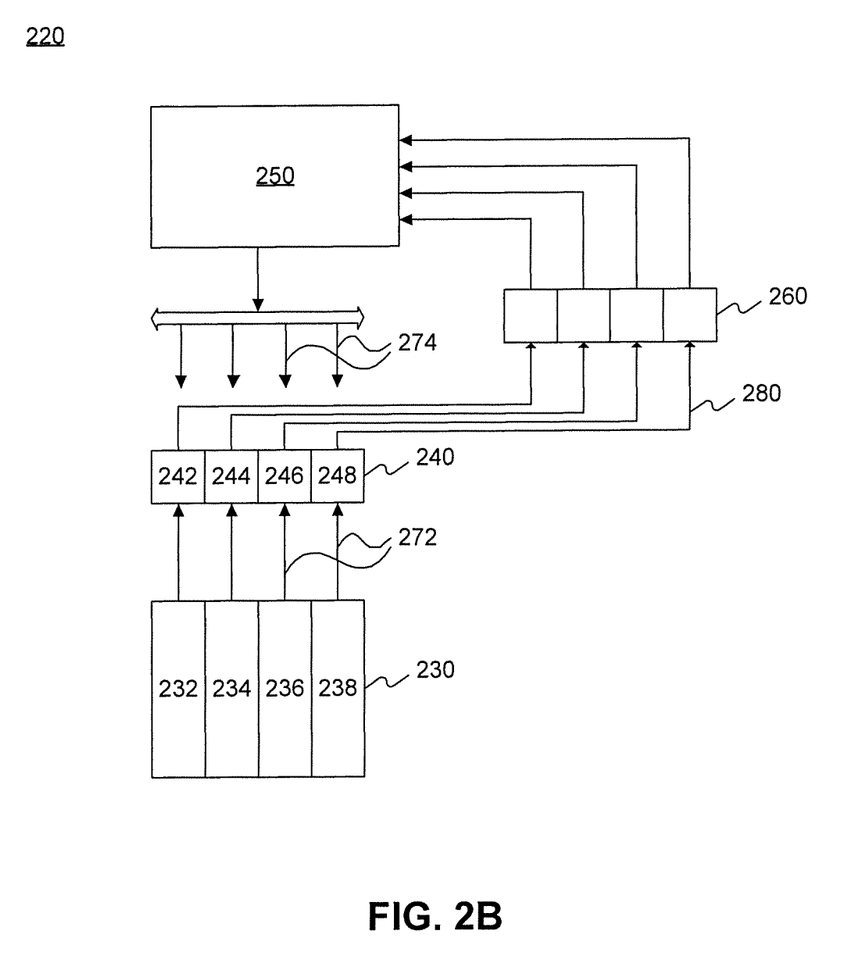
FIG. 2B illustrates an exemplary hardware neural network processor, consistent with embodiments of the present disclosure.

Private memory module 230 can be partitioned into separate private memory blocks, such that, each of the multiple processing units 242, 244, 246, and 248 has a corresponding private memory block 232, 234, 236, and 238, as shown in FIG. 2B.

Input operands 270 can be the input data operated on by processing unit array 240. In some embodiments, input operands 270 of FIG. 2A can include one or more private input operand(s) 272 and one or more shared input operand(s) 274, as shown in FIG. 2B. Private input operand 272 can be stored in private memory module 230 and shared input operand 274 can be stored in shared memory module 250.

In the application of neural networks, software algorithms 210 have shared data that can be stored in shared memory module 250 and can be broadcasted to each of the multiple processing units 242, 244, 246, and 248 of processing unit array 240 as a shared operand 274. For example, the algorithm illustrated in FIG. 2A is computing a vector operation of:

$$A=\text{sigmoid}(b+X*W1) \quad \text{(Eq. 1)}$$

which is a representative operation in layer 200 of a neural network called out often in deep learning algorithms. With reference to equation 1, "b" can include a constant value, "X" can include a shared input operand 274, and "W1" can include a private input operand 272.

With reference to FIG. 2A, the vector size can be set as any natural number. Here, a vector size of 4 is taken as an example, and a 4-way SIMD hardware to compute the vector is used. The processing units 242, 244, 246, and 248 can compute, in parallel, the following operations:

$$a1=\text{sigmoid}(b+x1*W1_{11}+x2*W1_{21}+x3*W1_{31}+x4*W1_{41}) \quad \text{(Eq. 2)}$$

$$a2=\text{sigmoid}(b+x1*W1_{12}+x2*W1_{22}+x3*W1_{32}+x4*W1_{42}) \quad \text{(Eq. 3)}$$

$$a3=\text{sigmoid}(b+x1*W1_{13}+x2*W1_{23}+x3*W1_{33}+x4*W1_{43}) \quad \text{(Eq. 4)}$$

$$a4=\text{sigmoid}(b+x1*W1_{14}+x2*W1_{24}+x3*W1_{34}+x4*W1_{44}) \quad \text{(Eq. 5)}$$

The shaded blocks and dotted lines in FIG. 2A indicate how "a1" is calculated. From this calculation, it is appreciated that data in each column of the "W1" array is local to a corresponding processing unit of processing unit array 240 and the data can accordingly be stored in corresponding memory block of private memory module 230, as a private input operand 272. For example, the data in each of the first, second, third, and fourth columns of the W1 array can be stored in their corresponding memory blocks 232, 234, 236, and 238 of private memory module 230 as private input operands.

With reference to FIG. 2A, the W1 array can include a matrix of stored data, wherein each element of the matrix is represented as W1ij or W1_ij (as shown later), where "i" represents the row number and "j" represents the column number in the matrix. For example, in Eq. 2, $W1_{41}$ represents the data stored in the element located at row 4 and column 1 of the W1 array. Other commonly known notations to address elements in a matrix can be used as well.

Simultaneously, data in the X-array is utilized by all processing units 242, 244, 246, and 248, and is accordingly stored in shared memory module 250, as shared input operand 274 and broadcasted to all components reading from shared memory module 250. Equations 2-5 represent exemplary operations performed in layer 200 of a neural network processor, designed to calculate a1, a2, a3 and a4.

In some embodiments, machine learning or deep learning includes training the neural network processor to generate an end result based on input data, accomplished by implementing algorithms for one or more layers of neural processing. For example, layer 200 of FIG. 2A, represents a first layer including an algorithm configured to perform an operation using a bias b, data stored in the X array, and data stored in W1 array. A second and third layer (not shown) can include algorithms using the bias b, data stored in the X array, and data stored in W2 and W3 array. Each layer can include a different value of bias b and different parameters stored in "W" array.

With reference to FIG. 2A, for example, array X can include an individual's scores in different classes. The value of x1 of the array X can be student A's Math score, x2 can be the English score, x3 can be the History score, and x4 can be the Science score. The end result can be whether the individual will be granted admission in a school or rejected, based on the scores (input data). As shown in FIG. 2A, and described in Equations 2-5, data x1-x4 is "shared" and common in calculating a1-a4.

Figure 3:
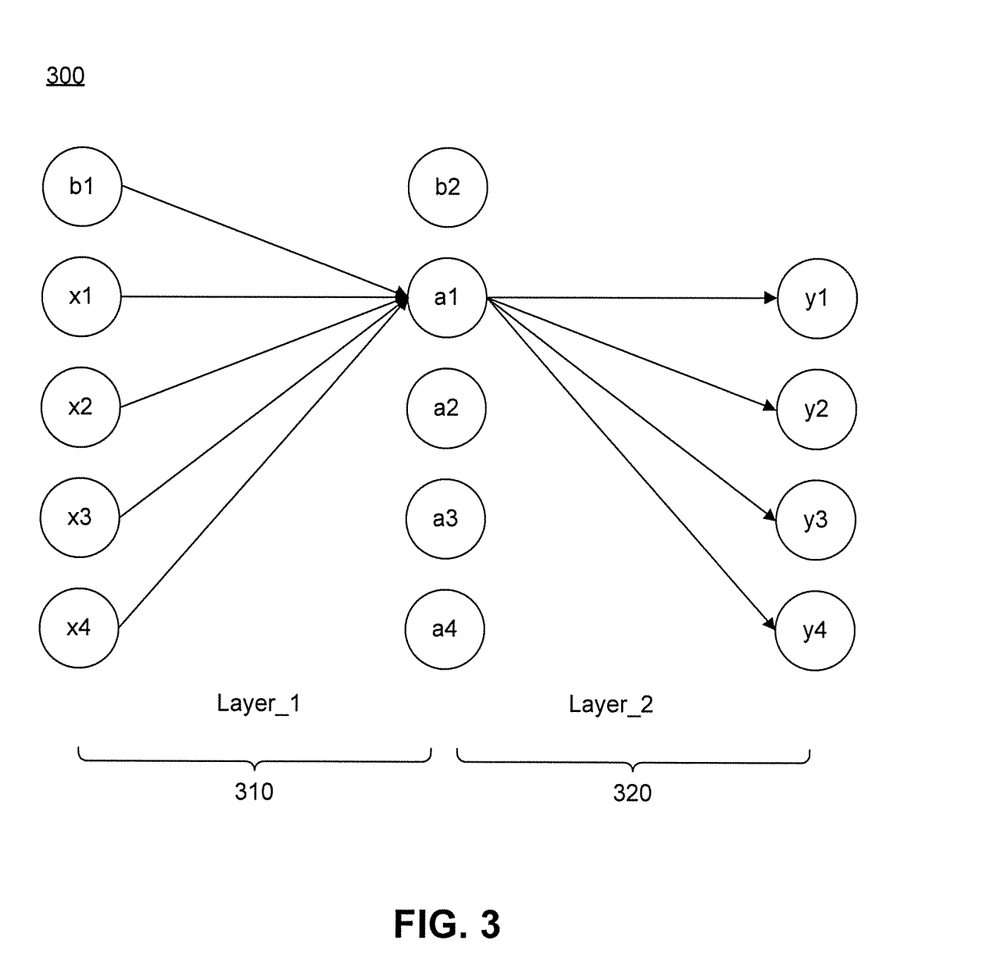
FIG. 3 illustrates data sharing in multi-layer networks, consistent with embodiments of the present disclosure.

FIG. 3 illustrates data sharing in multi-layer networks. Data sharing, as described herein, refers to how previously private data can become shared data in a later phase of a program. In some embodiments, neural network architecture 300 includes multiple layers, for example, layers 310 and 320. In some embodiments, output operand 280 of layer 310 can be used as an input operand 270 for layer 320. In some embodiments, the output operand 280 of one layer can be utilized as input operand 270 by one or more layers.

For example, in layer 310, a1 is calculated by processing unit 242 of private memory module 230. The data in a1 becomes a broadcasting input for layer 320. Generally, a neural network can be organized in layers. Each layer can perform one or more calculations on its inputs and generate an output. The output of a layer can be passed onto a next layer for further processing. For example, an output of a previous layer can be an input for the next layer. Accordingly, the locally generated "a"s have to be either stored back to shared memory 250, or stored to private memory 230 and copied later to shared memory 250.

As an alternative solution to storing in private memory 230 and copying to shared memory 250 later, output operand 280 from a1 can be stored back directly to shared memory 250 than memory copying. Nevertheless, this alternative solution could still slow down the program. Since a single processing unit, for example processing unit 242, can finish only one multiply-add operation per cycle, say Xi*W1_ij, each calculation of "a" can be performed over multiple cycles. For this reason, only one operand of W1_ij is read out from private memory 230 in each cycle, thus only one "X" is needed from shared memory 250. Consequently, a common design of each memory module is single-read/single-write per cycle. When all "a"s are generated simultaneously by multiple processing units in the last cycle, shared memory 250 may not have the ability to write them all back.

In some embodiments, a write buffer 260 is introduced to allow shared memory 250 more time to consume these output operands 280 individually. However, when the output speed of processing unit array 240 is faster than the width of write buffer 260, e.g., the size of A is greater than X, write buffer 260 may propagate a back pressure, forcing the processing unit array 240 to slow down, resulting in the slowdown of the overall program execution.

Figure 4A:
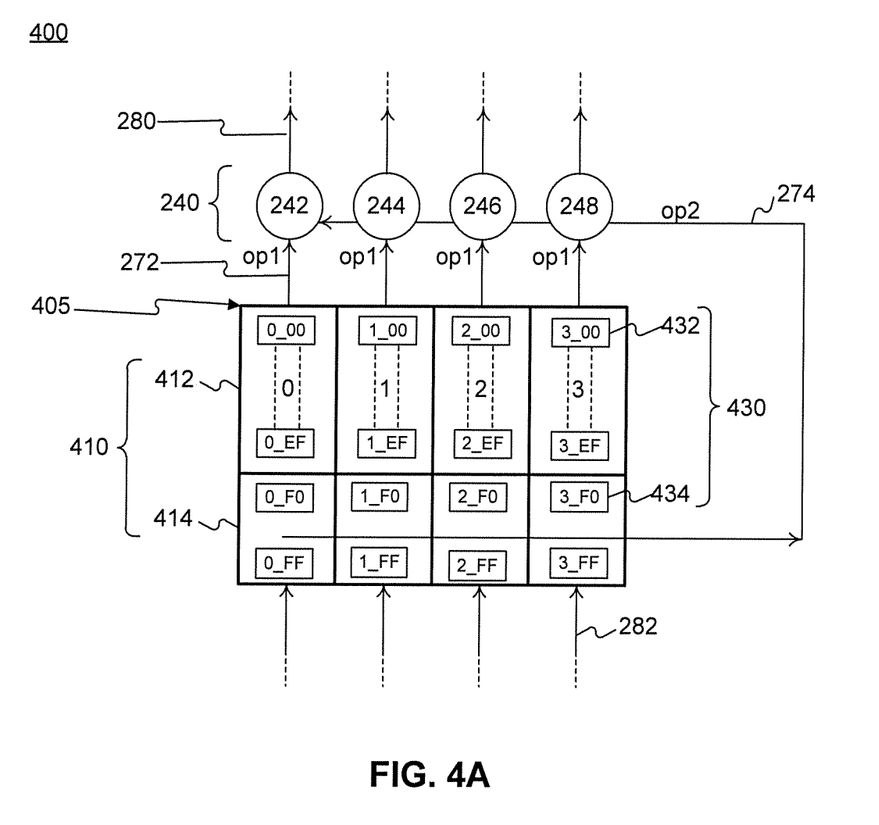
FIG. 4A illustrates a schematic diagram of an exemplary hardware including unified organization of memory modules, consistent with embodiments of the present disclosure.

FIG. 4A illustrates a schematic diagram of an exemplary hardware system 400 including unified organization of memory modules. Hardware system 400 includes a unified storage medium 405 and processing units 242, 244, 246, and 248. Unified storage medium 405 includes one or more storage modules 410, each including storage cells 430 configured to store input operand 270, output data 280. Multiple storage modules 410 can be merged into a single medium to form unified storage medium 405. Each storage module 410 can include a private storage module 412 and a shared storage module 414.

Hardware system 400 can include multiple processing units 242, 244, 246, and 248. Each of the multiple processing units of the processing unit array 240 is configured to communicate with one or more storage modules. For example, processing unit 242 can receive private input operand 272 from private storage module 412. Processing unit 242 can also receive shared input operand 274 from one or more shared storage modules 414. In some embodiments, processing unit array 240 is configured to receive private input operand 272 from private storage module 412, receive shared input operand 274 from shared storage module 414, and generate an output operand 280 based on private input operand 272 and shared input operand 274.

Figure 4B:
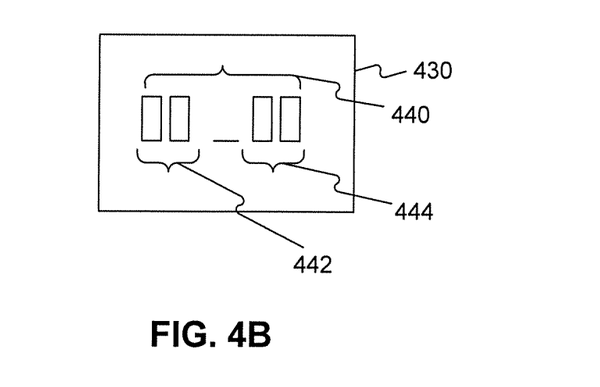
FIG. 4B illustrates an exemplary storage cell of a unified storage medium, consistent with embodiments of the present disclosure.

As illustrated in FIG. 4B, each of the storage cells 430 can be uniquely identified by a unique identifier 440. Unique identifier 440 can be a bit address including high-order bits 442 and low-order bits 444, or a byte address including high-order and low-order bytes, or a combination thereof. In computing, high-order bits 442 can be the most significant bit (MSB). The MSB can also be referred to as the left-most bit due to the convention in positional notation of writing more significant digits further to the left. Low-order bits 444, on the other hand, are referred to as bits in the right-most position. For example, in a unique identifier 440 having a bit address "2_E5", the high-order bits 442 refer to the left-most bit, i.e. "2" and the low-order bits 444 refer to the bits on the right side, i.e. "E5".

In some embodiments, storage cell 430 is a private storage cell 432 or a shared storage cell 434. Private storage cells 432 can be located within private storage module 412. Shared storage cells 434 can be located within shared storage module 414. High-order bits 442 of unique identifier 440 are configured to indicate a target storage module for operand (270, 280) and low-order bits 444 of unique identifier 440 are configured to indicate a target storage cell within target storage module, for operand (270, 280). For example, unique identifier 440 having a bit address "2_E5" refers to storage module "2", and storage cell "E5" within storage module "2". In other words, high-order bits 442 can also indicate the processing unit to which the storage module is "private" to, and low-order bits 444 indicate the location within the storage module.

It is to be appreciated that private storage cells 432 and shared storage cells 434 are physically indistinguishable storage cells and are not pre-labelled as such. The attribute of "private" and "shared" for a storage cell is determined based on the compiler-generated instructions programmed to address the data. For example, data can be stored in any cell. During a read step, if the compiler-generated instructions refer to the data as "private," the data may be read out in parallel as private input operand 272. Alternatively, if the compiler-generated instructions refer to the data as "shared," the data may be read out as shared input operand 274.

In some embodiments, unique identifier 440 includes other characters, for example, numeric characters, alpha-numeric characters, hexadecimal numerals (e.g., shown in FIG. 4A), octal numerals, or the like, addressable by a software addressing mode.

Referring back to FIG. 4A, processing unit array 240 or each of the multiple processing units can generate output data 280. Output data 280 can be a private output data 282 or a shared output data 284, determined by the operations in the next layer of a multi-layered algorithm for a neural network processor. As illustrated in FIG. 4A, output data 280 can be considered private output data 282 since it is written back to unified storage medium in parallel in each of the storage modules 410.

In some embodiments, neural network processors comprise a compiler (not shown). The compiler is a program or computer software that transforms computer code written in one programming language into another programming language to create an executable program. In machining applications, a compiler can perform a variety of operations, for example, pre-processing, lexical analysis, parsing, semantic analysis, conversion of input programs to an intermediate representation, code optimization, and code generation, or combinations thereof.

Figure 5:
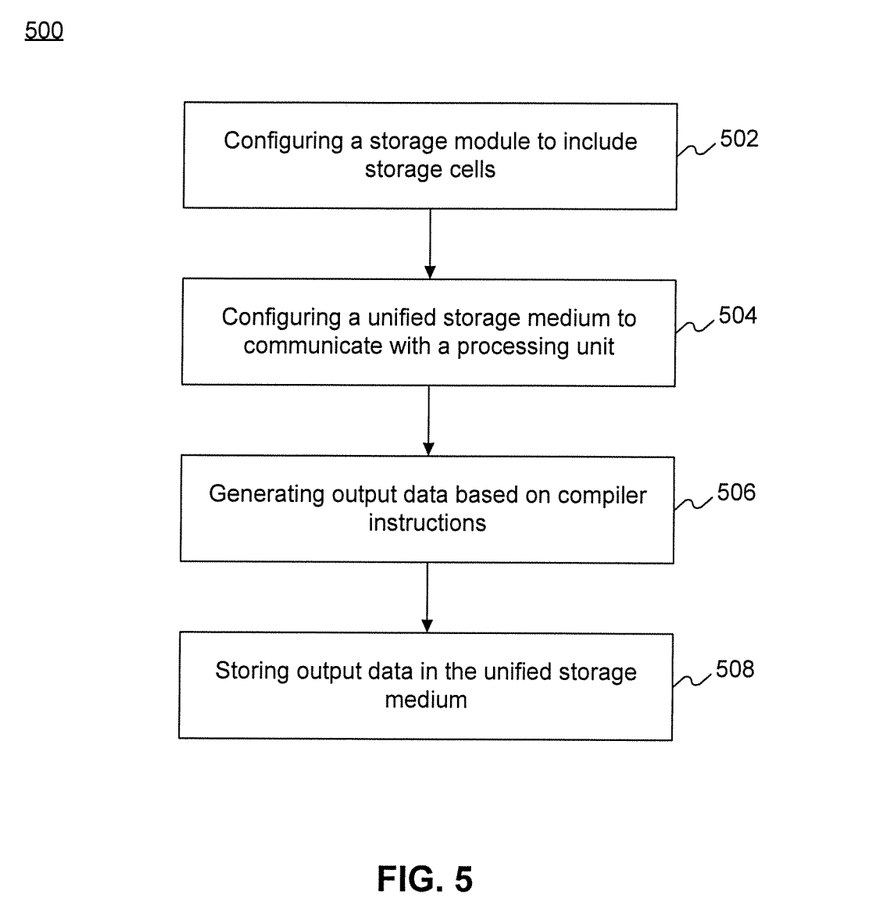
FIG. 5 illustrates a process flowchart of an exemplary data organization operation, consistent with embodiments of the present disclosure.

FIG. 5 is a process flowchart of an exemplary data organization operation 500, consistent with embodiments of the present disclosure. For example, data organization operation 500 can be performed by an on-chip communication system (e.g., on-chip communication system 110).

Step 502 includes configuring a storage module (e.g., storage module 410) of a unified storage medium (e.g., unified storage medium 400) to include multiple storage cells (e.g. storage cells 430). In some embodiments, step 502 includes configuring a private storage module (e.g., private storage module 412) to include private storage cells (e.g., private storage cell 432) and/or a shared storage module 414 (e.g., shared storage module 414) to include shared storage cells (e.g., shared storage cell 434). Configuring a storage module to include storage cells can comprise allocating storage space based on the total storage space available, software programs or algorithms, hardware limitations, time restrictions, and the like. If a software application or an algorithm is multi-layered and requires multiple layers of computation including more shared data than private data, the storage module can be configured to comprise more shared storage cells or more shared storage modules.

Step 504 includes configuring a storage medium (e.g., unified storage medium 400 of FIG. 4A) to communicate with a processing unit (e.g., processing unit array 240) or multiple processing units. In some embodiments, the processing unit is an Arithmetic Logic Unit (ALU), a Floating Point Unit (FPU), a Central Processing Unit (CPU), or a Graphics Processing Unit (GPU). A single CPU can contain one or more ALUs. Generally, an ALU is a combinational digital electronic circuit that performs arithmetic and bitwise operations on integer binary numbers. The processing unit can include multiple processing units, for example, an array of processing units configured to operate in parallel.

Communicating with a processing unit can include receiving data generated by the processing unit, or providing stored data to the processing unit. The storage medium can be the source of data to be computed on or the target of data storage. In some embodiments, the hardware system comprises a single processing unit configured to receive data from multiple storage modules. The hardware system can also include a unique processing unit for each storage module, configured to receive data only from the corresponding storage module.

Step 506, processing unit (e.g., processing unit array 240) generates output data (e.g., output data 280) based on the instructions generated by a compiler. In some embodiments, the compiler may be a program or computer software that transforms computer code written in one programming language into another programming language to create an executable program. The compiler can generate a set of instructions configured to access data from a storage medium, execute a desired operation on the accessed data, generate output data based on the operation, and store the generated output data back into the storage medium for subsequent processing. The instructions can also include assigning a characteristic to the input and the output data. The characteristic of the data can be private, shared, restricted, or the like.

In the example discussed here, compiler generates the following code for the vector operation "A=X*W1", where "X" can be considered as operand 2, and "W1" can be considered as operand 1. The set of instructions will be described with reference to FIG. 4A, in accordance with embodiments of the disclosure.

i1: LOAD.SIMD OP1 0x0_00
i2: LOAD.SHARED OP2 0x0_F0
i3: MUL RESULT OP1 OP2
i4: STORE.SIMD RESULT 0x0_F1;

The instructions in the aforementioned set of instructions generally comprise an operation on the data, characteristic of the data, and a target location within the storage medium.

In some embodiments, operation on the data includes load (reading), store (writing), arithmetic operations, (e.g., addition, subtraction, multiplication, division) copy, paste, and the like. Characteristic of the data can refer generally to the accessibility of the data within the storage medium. Characteristic of the data can include private, shared, restricted, allowed, global, local, or combinations thereof. Data, in general, is referred to as an operand. Data can be an input operand, for example, operand 1 (OP1) and operand 2 (OP2), or an output data based on the vector operation being performed.

In the set of instructions i1-i4, the subfield of load/store instructions implies how to load/store the data. Subfield ".SHARED" implies that the data should be read or written as shared data. In this mode, both high-order bits (e.g., 442 of FIG. 4B) and low-order bits (e.g., 444 of FIG. 4B) are utilized to determine the target location of input operand or output data. Subfield ".SIMD" implies that the data should be read or written as private data in parallel, wherein, the high-order bits can be disregarded by hardware and the low-order bits are utilized to determine the target location of input operand or output data.

In instruction i1, each processing unit (e.g., 242, 244, 246, and 248 of FIG. 4A) reads input operand 1 (e.g., private input operand 272) in parallel. The high-order bit "0" in bit address "0_00" is not utilized, and the low-order bits "00" indicate the storage cell and a characteristic of the storage cell. (e.g., private storage cell 432) For example, with reference to FIG. 2A, all data in row 1 of the "W1" array (W1_li) is read out simultaneously but separately to each corresponding processing unit. The "LOAD.SIMD" field implies that the data should be read in parallel.

In instruction i2, input operand 2 (e.g., shared input operand 274) is read once and broadcast to all processing units, as illustrated in FIG. 4A. The high-order bit "0" in bit address "0_F0" indicates the storage module where the data is stored, and the low-order bits "F0" indicate the storage cell and a characteristic of the storage cell in which the data is stored (e.g., shared storage cell 434). For example, with reference to FIG. 2A, the data in "X1" of the "X" array is read out read once and broadcast to each corresponding processing unit. The LOAD.SHARED field implies that the data should be read as shared data between all processing units.

In instruction i3, processing unit performs multiplication of input operands 1 and 2, as defined by the vector operation, to generate an output data "A". The arithmetic operation can include basic arithmetic functions of addition, subtraction, multiplication, or division, or combinations thereof. In some embodiments, processing unit is configured to perform complex arithmetic and algebraic functions, logarithmic functions, exponentiation, or the like.

In instruction i4, generated output data "A" in instruction i3 is stored in parallel back to storage medium for further processing. Generated output data "A" (e.g., output data 280) can be used as the input operand in the next layer of the multi-layered algorithm. The high-order bit "0" in bit address "0_F1" is not utilized by hardware, and the low-order bits "F1" indicate the storage cell and a characteristic of the storage cell (e.g., shared storage cell 434) for the output data to be stored. For example, with reference to FIG. 2B, output data 280 may be temporarily stored in a temporary storage (e.g., write buffer 260) before storing it in the shared or private storage module of the unified storage medium.

In step 508, generated output data is stored back in the unified storage medium for further processing. Generally, a neural network can be organized in multiple layers. The output of a layer can be passed onto a next layer for further processing. For example, an output of a previous layer can be an input for the next layer.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the invention disclosed herein. It is intended that the specification and examples be considered as exemplary only, with a true scope and spirit of the invention being indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method.

The invention claimed is:

1. A computer system comprising:
a unified storage medium including a plurality of storage modules each having a plurality of storage cells configured to store data, wherein:
each of the plurality of storage modules is addressable as a private storage module and as a shared storage module, and
each of the plurality of storage cells within each of the plurality of storage modules is identified by a unique cell identifier; and
a processing array possessing a plurality of processing units and in communication with the unified storage medium, the processing array configured to execute an instruction on the plurality of processing units by causing each of the plurality of processing units to:
receive input data from a target storage cell of the plurality of storage cells within the plurality of storage modules, and generate output data based on the received input data,
wherein an attribute of the target storage cell is determined depending on how the instruction, which instructs to read out the input data previously stored in the target storage cell having an attribute from a previous instruction, refers to the input data stored in the target storage cell, and wherein the attribute of the target storage cell is switched to a private attribute when the instruction refers the input data as private and the attribute of the target storage cell is switched to a shared attribute when the instruction refers the input data as shared.

2. The computer system of claim 1, wherein the unique cell identifier of a storage cell comprises a bit address including a first plurality of bits and a second plurality of bits.

3. The computer system of claim 2, wherein the first plurality of bits indicates a target storage module of the plurality of storage modules, and wherein the second plurality of bits indicates the target storage cell of the plurality of storage cells within the target storage module.

4. The computer system of claim 2, wherein the instruction includes a reference to a target unique cell identifier and a reference attribute indicating whether the reference to the target unique cell identifier is a private reference or a shared reference.

5. The computer system of claim 1, wherein the plurality of storage modules are configured to communicate with the plurality of processing units.

6. The computer system of claim 4, wherein:
the reference attribute indicates the reference to the target unique cell identifier is a shared reference, and
the processing array is further configured to:
retrieve the input data from the target storage cell identified by the target unique cell identifier, and
broadcast the retrieved input data to the plurality of processing units.

7. The computer system of claim 1, wherein the unified storage medium and the processing array are configured to be uniformly addressed by a software code or a software program.

8. The computer system of claim 4, wherein:
each of the plurality of processing units has an assigned storage module,
the reference attribute indicates the reference to the target unique cell identifier is a private reference, and
the processing array is further configured to cause each of the plurality of processing units to:
retrieve the input data from the target storage cell within a processing unit's respective assigned storage module using the target unique cell identifier.

9. The computer system of claim 5, wherein the processing array is further configured to assign a storage module to each of the plurality of processing units.

10. A unified storage medium comprising:
a plurality of storage modules each having a plurality of storage cells configured to store data, wherein:
each of the plurality of storage modules is addressable as a private storage module and as a shared storage module, and
each of the plurality of storage cells within each of the plurality of storage modules is identified by a unique cell identifier,
wherein an attribute of a storage cell of the plurality of storage cells is determined depending on how an instruction, which instructs to read out previously stored data from the storage cell having an attribute from a previous instruction, refers to the data stored in the storage cell, and wherein the attribute of the storage cell is switched to a private attribute when the instruction refers the data as private and the attribute of the storage cell is switched to a shared attribute when the instruction refers the data as shared.

11. The unified storage medium of claim 10, wherein the unique cell identifier of a storage cell comprises a bit address including a first plurality of bits and a second plurality of bits.

12. The unified storage medium of claim 11, wherein the first plurality of bits indicates a target storage module of the plurality of storage modules, and wherein the second plurality of bits indicates a target storage cell of the plurality of storage cells within the target storage module.

13. The unified storage medium of claim 12, wherein:
the instruction includes a reference to a target unique cell identifier and a reference attribute indicating whether the reference to the target unique cell identifier is a private reference or a shared reference.

14. The unified storage medium of claim 13, wherein the plurality of storage modules are configured to communicate with a plurality of processing units.

15. The unified storage medium of claim 14, wherein:
each of the plurality of processing units has an assigned storage module,
the reference attribute indicates the reference to the target unique cell identifier is a private reference, and
the plurality of processing units are configured to execute the instruction by retrieving input data from a target storage cell within a processing unit's respective assigned storage module using the target unique cell identifier.

16. The unified storage medium of claim 14, wherein each of the plurality of processing units are assigned a storage module.

17. A method for organizing data in a computer system, the method comprising:
receiving an instruction at a processing array possessing a plurality of processing units and in communication with a unified storage medium, wherein:
the unified storage medium includes a plurality of storage modules each having a plurality of storage cells configured to store data, each of the plurality of storage modules is addressable as a private storage module and as a shared storage module, and each of the plurality of storage cells within each of the plurality of storage modules is identified by a unique cell identifier; and executing the received instruction on the plurality of processing units by:

receiving input data from a target storage cell of the plurality of storage cells within the plurality of storage modules, and generating output data based on the received input data, wherein an attribute of the target storage cell is determined depending on how the instruction, which instructs to read out the input data previously stored in the target storage cell having an attribute from a previous instruction, refers to the input data stored in the target storage cell, and wherein the attribute of the target storage cell is switched to a private attribute when the instruction refers the input data as private and the attribute of the target storage cell is switched to a shared attribute when the instruction refers the input data as shared.

18. The method of claim 17, wherein the unique cell identifier of a storage cell comprises a bit address including a first plurality of bits and a second plurality of bits.

19. The method of claim 18, wherein the first plurality of bits indicates a target storage module of the plurality of storage modules, and wherein the second plurality of bits indicates the target storage cell of the plurality of storage cells within the target storage module.

20. The method of claim 19, wherein the instruction includes a reference to a target unique cell identifier and a reference attribute indicating whether the reference to the target unique cell identifier is a private reference or a shared reference.

21. The method of claim 17, wherein the plurality of storage modules are configured to communicate with the plurality of processing units.

22. A method for organizing data in a unified storage medium, the method comprising:

communicating data stored on the unified storage medium, wherein:

the unified storage medium includes the plurality of storage modules each having a plurality of storage cells configured to store data, each of the plurality of storage modules is addressable as a private storage module and as a shared storage module, and each of the plurality of storage cells within each of the plurality of storage modules is identified by a unique cell identifier, wherein an attribute of a storage cell of the plurality of storage cells is determined depending on how an instruction, which instructs to read out data previously stored in the storage cell having an attribute from a previous instruction, refers to the data, and wherein the attribute of the storage cell is switched to a private attribute when the instruction refers the data as private and the attribute of the storage cell is switched to a shared attribute when the instruction refers the data as shared.

23. The method of claim 22, wherein:

communicating data stored on the unified storage medium comprises communicating input data, from one or more of the plurality of storage cells within the plurality of storage cell modules, to a plurality of processing units in communication with the unified storage medium; and the plurality of processing units are configured to:
receive the input data communicated from the unified storage medium, and
generate output data based on the received input data.

24. The method of claim 23, wherein the unique cell identifier of a storage cell comprises a bit address including a first plurality of bits and a second plurality of bits.

25. The method of claim 24, wherein the first plurality of bits indicates a target storage module of the plurality of storage modules, and wherein the second plurality of bits indicates a target storage cell of the plurality of storage cells within the target storage module.

26. The method of claim 25, wherein:

the instruction includes a reference to a target unique cell identifier and a reference attribute indicating whether the reference to the target unique cell identifier is a private reference or a shared reference.

27. The method of claim 26, wherein:

each of the plurality of processing units has an assigned storage module, the reference attribute indicates the reference to the target unique cell identifier is a private reference, and the plurality of processing units are configured to execute the instruction by receiving input data from a target storage cell within a processing unit's respective assigned storage module using the target unique cell identifier.

28. The method of claim 20, wherein:

each of the plurality of processing units has an assigned storage module, the reference attribute indicates the reference to the target unique cell identifier is a private reference, and executing the received instruction on the plurality of processing units further comprises, for each of the plurality of processing units:

retrieving the input data from the target storage cell within a processing unit's respective assigned storage module using the target unique cell identifier.

* * * * *